(12) United States Patent
Chien et al.

(10) Patent No.: US 9,809,447 B2
(45) Date of Patent: Nov. 7, 2017

(54) PRESSURE SENSOR

(71) Applicant: MiraMEMS Sensing Technology Co., Ltd., Suzhou (CN)

(72) Inventors: Yu-Hao Chien, Taipei (TW); Li-Tien Tseng, Taoyuan County (TW)

(73) Assignee: MIRAMEMS SENSING TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 15/414,074

(22) Filed: Jan. 24, 2017

(65) Prior Publication Data

US 2017/0129774 A1 May 11, 2017

Related U.S. Application Data

(62) Division of application No. 14/596,967, filed on Jan. 14, 2015, now Pat. No. 9,598,275.

(30) Foreign Application Priority Data

Jun. 25, 2014 (TW) .............................. 103121910 A

(51) Int. Cl.
*B81C 1/00* (2006.01)
*B81B 7/02* (2006.01)
*B81B 7/00* (2006.01)

(52) U.S. Cl.
CPC ........ *B81B 7/0041* (2013.01); *B81C 1/00238* (2013.01); *B81C 1/00293* (2013.01); *B81B 2201/0264* (2013.01); *B81B 2203/0315* (2013.01); *B81B 2207/012* (2013.01); *B81B 2207/07* (2013.01); *B81B 2207/094* (2013.01); *B81C 2201/112* (2013.01); *B81C 2203/0172* (2013.01); *B81C 2203/0792* (2013.01)

(58) Field of Classification Search
CPC ... B81B 7/004; B81B 7/0041; B81B 2207/07; B81B 2207/094; B81C 1/00238; B81C 1/00293; B81C 7/00; B81C 2203/0172; B81C 2203/0792; H01L 23/10; H01L 2924/1461
USPC ...................... 257/415–420; 438/50–53, 406
See application file for complete search history.

(56) References Cited

U.S. PATENT DOCUMENTS

2012/0248615 A1 10/2012 Chien et al.
2013/0283912 A1* 10/2013 Lin ..................... G01P 15/0802
73/514.16

OTHER PUBLICATIONS

Yuhan Cao et al., "Wafer-Level Package with Simultaneous TSV Connection and Cavity Hermetic Sealing by Solder Bonding for MEMS Device", IEEE Transctions on Electronic Packaging Manufacturing, vol. 32, No. 3, Jul. 2009 (first published May 29, 2009).

* cited by examiner

*Primary Examiner* — Johannes P Mondt
(74) *Attorney, Agent, or Firm* — Muncy, Geissler, Olds & Lowe, P.C.

(57) ABSTRACT

A pressure sensor using the MEMS device comprises an airtight ring surrounding a chamber defined by the first substrate and the second substrate. The airtight ring extends from the upper surface of the second substrate to the interface between the first substrate and the second substrate and further breaks out the interface. The pressure sensor utilizes the airtight ring to retain the airtightness of the chamber.

14 Claims, 8 Drawing Sheets

PRESSURE SENSOR

CROSS-REFERENCE TO RELATED APPLICATIONS

This application is a Divisional co-pending application Ser. No. 14/596,967, filed on Jan. 14, 2015, for which priority is claimed under 35 U.S.C. §120; and this application claims priority of Application No. 103121910 filed in Taiwan on Jun. 25, 2014 under 35 U.S.C. §119, the entire contents of all of which are hereby incorporated by reference.

BACKGROUND OF THE INVENTION

1. Field of the Invention

The present invention relates to a pressure sensor and a manufacture method thereof, particularly to a pressure sensor and manufacture method thereof complied with the Microelectromechanical System (MEMS) equipment.

2. Description of the Prior Art

Since the development in 1970, the Microelectromechanical System (MEMS) equipment has been improved from subject in the laboratory research to that for high-level system integration. The MEMS equipment also has a popular application and an amazing and stable growth in the public consumable field. The MEMS equipment is capable of achieving the functions of the equipment through detecting or controlling the kinematic physical quantity of the movable MEMS elements. For example, the pressure sensor implemented with the MEMS equipment utilizes the pressure difference between an airtight chamber and the outside environment to drive the MEMS element, produce the deformation, and detect the pressure difference from the outside environment. To sum up the foregoing descriptions, how to preserve the airtight chamber is the most important goal of the pressure sensor implemented with the MEMS equipment.

SUMMARY OF THE INVENTION

The present invention is directed to providing a pressure sensor and a manufacture method thereof implemented with the MEMS equipment. An airtight ring is configured for surrounding a chamber defined by a first substrate and a second substrate, and the airtight ring extends from the upper surface of the second substrate comprising the MEMS device to the surface between the first substrate and the second substrate to retain the airtight chamber.

The pressure sensor according to one embodiment of the present invention comprises a first substrate and a second substrate. The first substrate comprises a metal layer, wherein the metal layer is partially exposed on a surface of the first substrate to form a first circuit, a second circuit and a conductive contact. The second substrate comprises a first surface and a second surface, wherein the second substrate faces the surface of the first substrate with the first surface and is electrically connected to the conductive contact. The second substrate comprises a MEMS element, corresponding to the first circuit and defining an airtight chamber with the first substrate and the second substrate; a reference element, corresponding to the second circuit and kept a fixed distance from the second circuit; and a first airtight ring configured surrounding the chamber, wherein the first airtight ring penetrates the second surface of the second substrate, extends to an interface between the first substrate and the second substrate, and protrudes from and breaks out the interface.

Other advantages of the present invention will become apparent from the following descriptions taken in conjunction with the accompanying drawings wherein certain embodiments of the present invention are set forth by way of illustration and examples.

BRIEF DESCRIPTION OF THE DRAWINGS

The foregoing aspects and many of the accompanying advantages of this invention will become more readily appreciated as the same becomes better understood by reference to the following detailed descriptions, when taken in conjunction with the accompanying drawings, wherein.

DESCRIPTION OF THE PREFERRED EMBODIMENT

Figure 1:
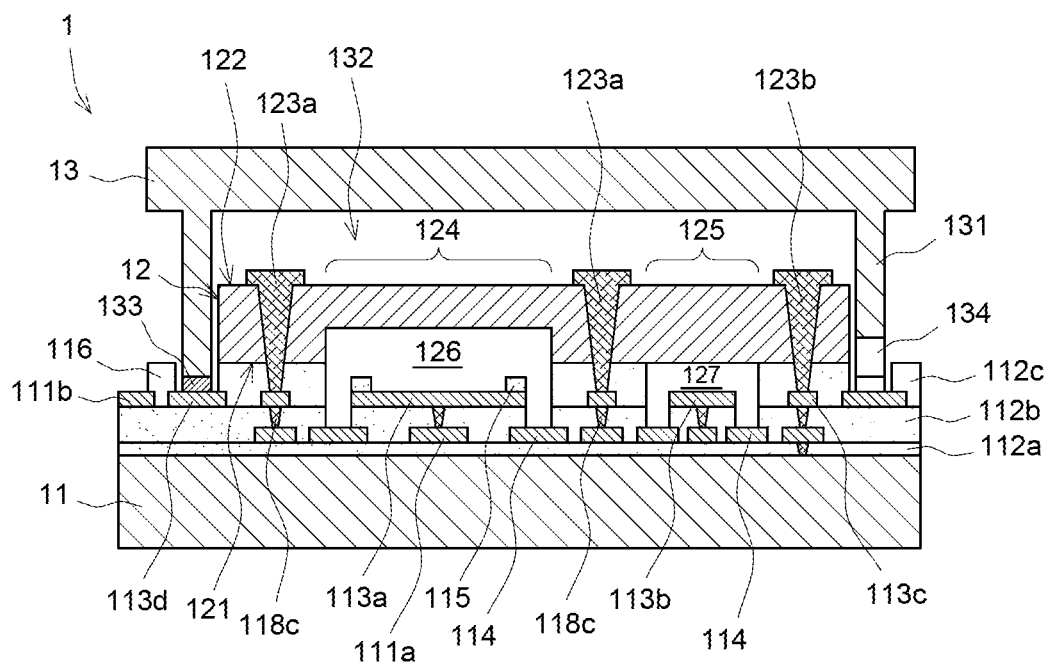
FIG. 1 is a cross-sectional diagram showing a pressure sensor of a preferred embodiment of the present invention.
Figure 2:
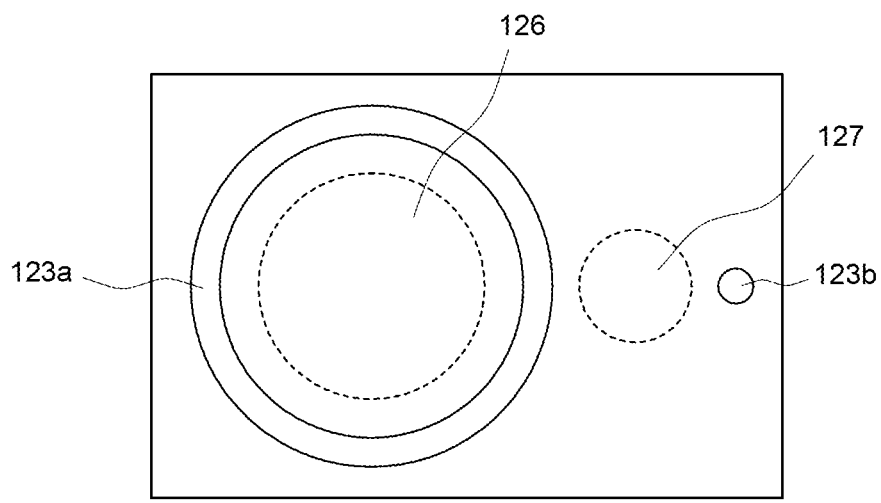
FIG. 2 is a schematic diagram showing the layout of the chamber and the airtight ring of the pressure sensor of a preferred embodiment of the present invention.

The pressure sensor of the present invention is accomplished with the microelectromechanical system (MEMS) equipment. Referring to FIG. 1 and FIG. 2, the pressure sensor 1 of one preferred embodiment of the present invention comprises a first substrate 11 and a second substrate 12. The first substrate 11 comprises at least one metal layer. In the embodiment shown in FIG. 1, the first substrate 11 comprises the metal layer 111a and 111b, and the metal layer 111b on the upper layer is partially exposed on the surface of the first substrate 11. The exposed metal layer 111b may function as a first circuit 113a, a second circuit 113b and a conductive contact 113c. In one preferred embodiment, the first substrate 11 is a complementary metal oxide semiconductor substrate.

The second substrate 12 comprises a first surface 121 and a second surface 122, and the second substrate 12 faces the surface of the first substrate 11 with the first surface 121 and is electrically connected to the conductive contact 113c of the first substrate 11. For example, the second substrate 12 comprises at least one conductive via 123b penetrating the first surface 121 and the second surface 122 of the second substrate 12. The conductive via 123b is electrically connected to the conductive contact 113c and the second substrate 12 through an ohmic contact, wherein the ohmic contact is formed by the conductive via 123b and the second surface 122 of the second substrate 12 or the side wall of the conductive via 123b. In one preferred embodiment, the ohmic contact region comprises at least one of silicon, aluminum-copper alloy, titanium nitride and tungsten.

Further, the second substrate 12 comprises a microelectromechanical system (MEMS) element 124, a reference element 125 and a first airtight ring 123a. The MEMS element 124 corresponds to the first circuit 113a of the first substrate 11 and defines an airtight chamber 126 with the first substrate 11 and the second substrate 12. The pressure difference between the inside and the outside of the chamber 126 may create a deformation of the MEMS element 124 forward or backward the first substrate 11. The MEMS element 124 is electrically coupled to the first circuit 113a to measure the deformation level of the MEMS element 124. The reference element 125 corresponds to the second circuit 113b and is kept a fixed distance from the second circuit 113b. To be simple, the reference element 125 is not deformed with the pressure difference, so that the reference element 125 is electrically coupled to the second circuit 113b to provide a stable reference signal. In One preferred embodiment, the thickness of the reference element 125 may be increased so as to avoid the reference element 125 from being deformed with the outside pressure difference.

The first airtight ring 123a is configured for surrounding the chamber 126. In one preferred embodiment, the shape of the first airtight ring 123a may be circular (as shown in FIG. 2), rectangle, polygon or other suitable shape. The first airtight ring 123a penetrates the second surface 122 of the second substrate 12 and extends to an interface between the first substrate 11 and the second substrate 12. It should be noted here that the first airtight ring 123a may further break out the interface between the first substrate 11 and the second substrate 12. According to this structure, the interface between the first substrate 11 and the second substrate 12 extending outward from the chamber 126 is blocked by the first airtight ring 123a to prevent the air leakage at the interface between the first substrate 11 and the second substrate 12 caused by the unevenness of the surface of the first substrate 11 or the first surface 121 of the second substrate 12, or the mounting failure between the first substrate 11 and the second substrate 12. In a preferred embodiment, the first airtight ring 123 extends to the metal layer 111b of the first substrate 11 and is connected to the metal layer 111b to further improve the airtightness of the chamber 126.

In one preferred embodiment, the material of the first airtight ring 123 may be the same as or different from the conductive material (such as tungsten) used in the conductive via 123b. It should be noted here that the conductive via 123b and the first airtight ring 123a may be integrated together. For example, the first airtight ring 123a is a conductive material, and the metal layer 111b connecting to the first airtight ring 123a is a well-designed conductive contact as well, so that the first airtight ring 123a may be used as a conductive via and provide an alternative conductive path of the electrical connection between the first substrate 11 and the second substrate 12. Besides, the conductive via 123b may be omitted as well.

In the embodiment shown in FIG. 1, the first substrate 11 comprises multiple metal layers 111a and 111b. For reducing the probability of air leakage between the metal layers 111a and 111b of the first substrate 11, a second airtight ring 118c may be configured corresponding to the first airtight ring 123a, that surrounds the chamber 126. The second airtight ring 118c is connected to the metal layers 111a and 111b to improve the airtightness of the first substrate 11.

Referring to FIG. 1, in one preferred embodiment, the pressure sensor further comprises a third substrate 13. The third substrate 13 comprises a plurality of bracket structure 131 surrounding a notch region 132. The third substrate 13 is configured above the second substrate 12 and is connected to the first substrate 11 through the bracket structure 131 to place the second substrate 12 in the notch region 132 of the third substrate 13. In one preferred embodiment, the third substrate 13 is conductive and the contact pad 133 is provided at the terminal of the bracket structure 131. The third substrate 13 is eutectically bonded with the first substrate 11 to make the contact pad 133 and the contact region 113d of the first substrate 11 forming a low-impedance conductive contact. For example, the third substrate 13 comprises at least one of silicon-doped ceramics having conductive plating, glass having Indium Tin Oxide (ITO) coating, and Tantalum oxide. The third substrate 13 also has a channel 134 connecting the notch region 132 and the outside to make the pressure of the notch region 132 and the outside equal. In one preferred embodiment, the channel 134 is configured on the terminal of the bracket structure 131.

Figure 3:
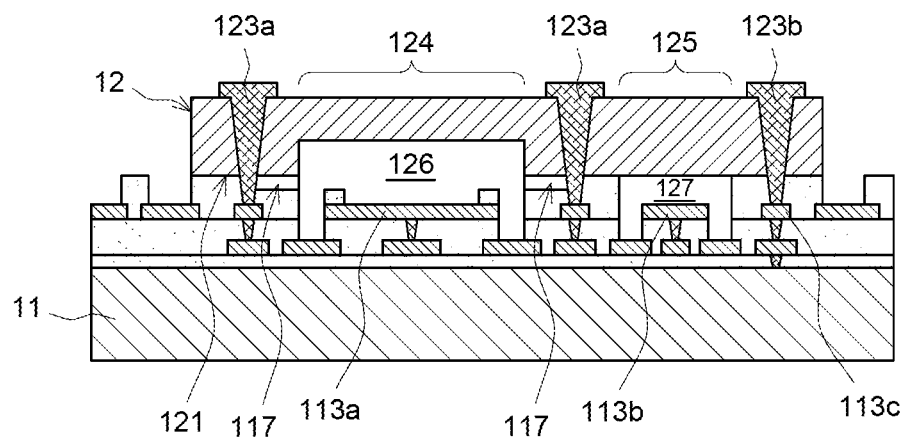
FIG. 3 is a cross-sectional diagram showing a pressure sensor of another preferred embodiment of the present invention.
Figure 4:
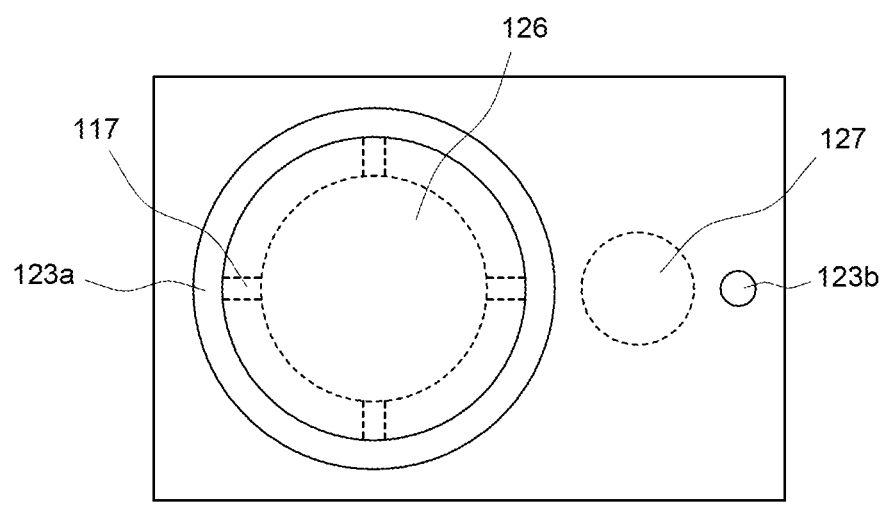
FIG. 4 is a schematic diagram showing the layout of the chamber, the airtight ring and the micro channel of the pressure sensor of a preferred embodiment of the present invention shown in FIG. 3.

Please refer to FIG. 3 and FIG. 4, in one embodiment, the first substrate 11 and the second substrate 12 further define a micro channel 117 extending from the chamber 126 to the first airtight ring 123a. Therefore, in the manufacture process, the anti-sticking material may be led to the chamber 126 via the micro channel 117 before forming the first airtight ring 123a and forms the anti-sticking layer on the inner surface of the chamber 126. For example, the anti-sticking material may be the self assembled monolayer (SAM) material, such as dichlordimethylsilane (DDMS), octadecyltrichlorsilane (OTS), perfluoroctyltrichlorsilane (PFOTCS), perfluorodecyl-trichlorosilane (FDTS), or fluoroalkylsilane (FOTS). The anti-sticking layer on the inner surface of the chamber 126 may avoid the sticking between the MEMS element 124 and the first substrate 11. Furthermore, an anti-moving bump 115 may be configured on the surface of the first substrate 11 corresponding to the MEMS element 124 to reduce the contacting area of the MEMS element 124 and the first substrate 11 and prevent failure caused by sticking between the MEMS element 124 and the first substrate 11.

Figure 5:
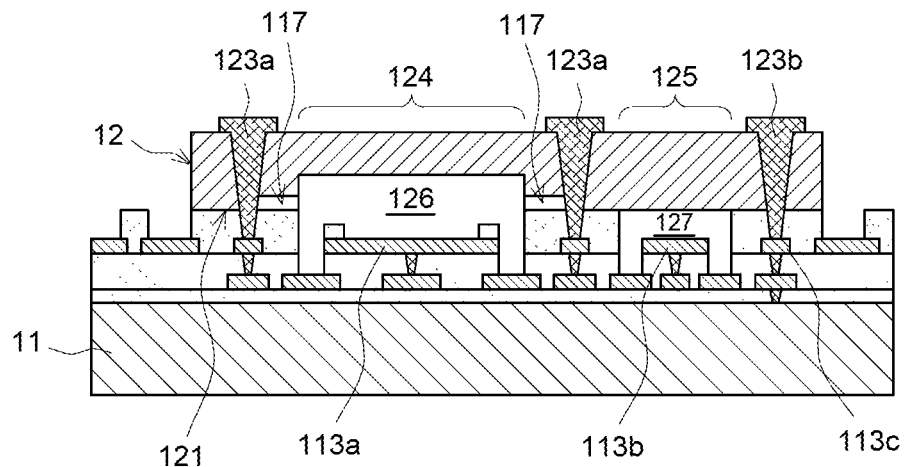
FIG. 5 is a cross-sectional diagram showing a pressure sensor of the third embodiment of the present invention.

In the embodiment shown in FIG. 3, the micro channel 117 is configured on the side of the first substrate 11, which forms a trench on the surface of the first substrate 11 and then mounts the first substrate 11 and the second substrate 12 to form the micro channel 117. In one preferred embodiment, referring to FIG. 5, the micro channel 117 may be also configured on the side of the second substrate 12, which forms a trench on the first surface 121 of the second substrate 12 and then connects the first substrate 11 and the second substrate 12 to form the micro channel 117.

Figure 7:
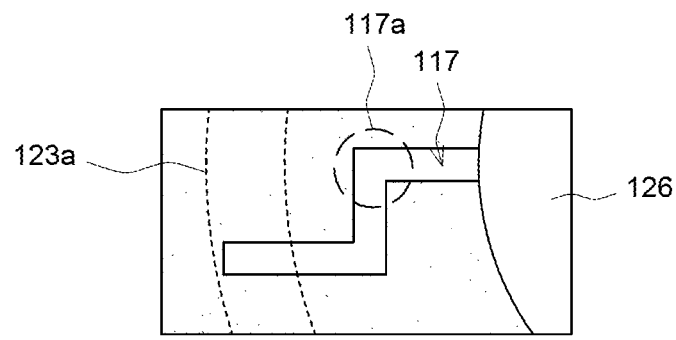
FIG. 7 is a partial schematic diagram showing the structure of the micro channel of the pressure sensor of a preferred embodiment of the present invention.

Refer to FIG. 7, which is a partial schematic diagram showing the structure of the micro channel of the unconnected second substrate 12. In the embodiment shown in FIG. 7, the micro channel 117 comprises a bent portion 117a bending to horizontal direction (along the interface between the first substrate and the second substrate). Therefore, when forming the first airtight ring 123a, material of the first airtight ring 123a will heap up in the bent portion 117a without contaminating the chamber 126. It may be understood that the same function may be also performed by the micro channel 117 having a bent portion bending to vertical direction (vertical to the first surface of the second substrate).

Figure 8:
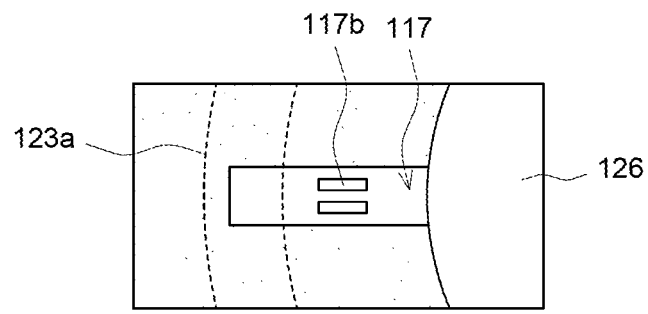
FIG. 8 is a partial schematic diagram showing the structure of the micro channel of the pressure sensor of a preferred embodiment of the present invention.
Figure 9:
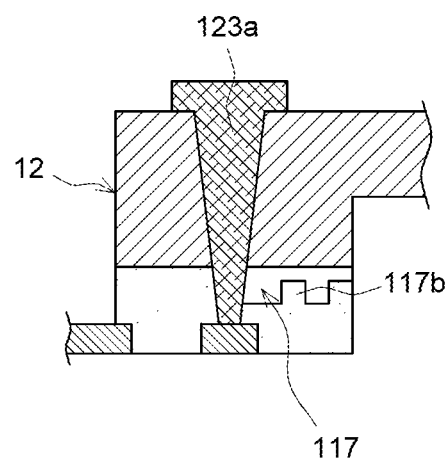
FIG. 9 is a partial cross-sectional diagram showing the structure of the micro channel of the pressure sensor of a preferred embodiment of the present invention.

Referring to FIG. 8, in one preferred embodiment, at least one dam 117b may be configured in the micro channel 117. The dam 117b may reduce the inner diameter of the micro channel 117 to allow the anti-sticking material to may pass through such that the material of the first airtight ring 123a would heap up in the dam 117b without contaminating the chamber 126. In another preferred embodiment, referring to FIG. 9, the dam 117b can also reduce the inner diameter of the micro channel 117 on vertical direction and only the above portion of the micro channel 117 can be passed through, so that the filler may be blocked in front of or within the dam 117b by the dam 117b.

Figure 6:
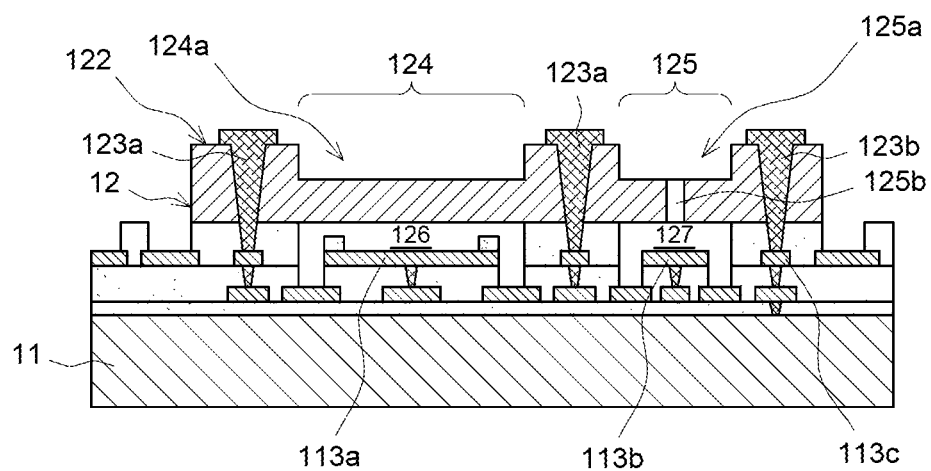
FIG. 6 is a cross-sectional diagram showing a pressure sensor of the fourth embodiment of the present invention.

In the embodiment shown in FIG. 1, a notch is formed on side of the first surface 121 of the second substrate 12 for thinning the MEMS element 124. The notch 124a may be also formed on side of the second surface 122 of the second substrate 12 for thinning the MEMS element 124, as shown in FIG. 6. In one preferred embodiment, a notch 125a may be also formed on side of the second surface 122 of the second substrate 12 for thinning the reference element 125. It should be understood that, for avoid the thinned reference element 125 deforming with the outside pressure difference, a channel 125b may be configured to connect the chamber 127 which is defined by the reference element 125 and then there is no pressure difference between the chamber 127 and the outside environment. Hence, the reference element 125 will not have deformation caused by the outside pressure difference.

Refer to FIGS. 10a to 10g, which are cross-sectional diagrams showing the manufacture steps of the pressure sensor of a preferred embodiment of the present invention. First, a first substrate 11 comprising a driving circuit and/or a detecting circuit is provided. The analog and/or digital circuits may be used in the first substrate 11, and are generally practiced by using application-specific integrated circuit (ASIC) designed devices. The first substrate 11 may be also named the electrode substrate. In one preferred embodiment of the present invention, the first substrate 11 may be any substrate with suitable mechanic stiffness, such as complementary metal oxide semiconductor (CMOS) substrate or glass substrate. Only one chip is shown in the cross-sectional figures, however, it is understood, a plurality of chips may be formed on one substrate simultaneously. It is only used for explaining the present invention with single device, not for limiting the manufacture method. In the following specification, a complete explanation of the wafer level process applied to a substrate to manufacture a plurality of chips or devices will be described. After the devices are manufactured, the dicing and singulation technologies may be applied to produce the single-device package to fit all applications.

Figure 10A:
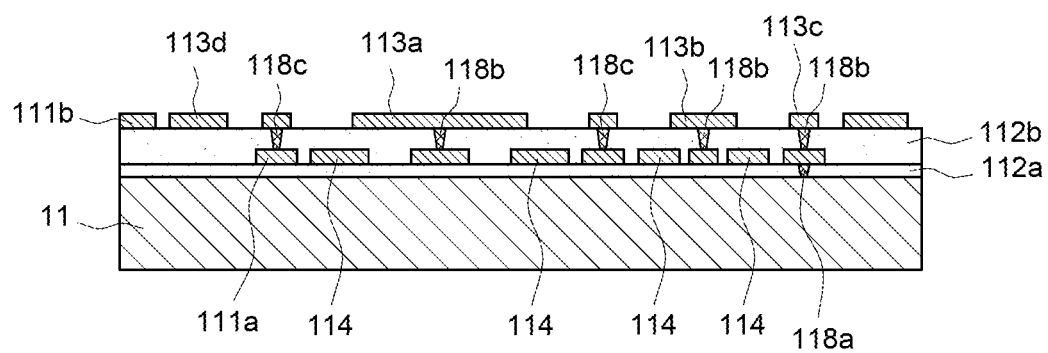
FIGS. 10a to 10g are cross-sectional diagrams showing the manufacture steps of the pressure sensor of a preferred embodiment of the present invention.

Referring to FIG. 10a, a first dielectric layer 112a with a predetermined thickness is configured on the first substrate 11. In one preferred embodiment, the first dielectric layer 112a may be a $SiO_2$ layer; however, other suitable materials may be used in the present invention as well and are also in the scope of the present invention. For example, in another embodiment, $Si_3N_4$ or SiON may be deposited to form the first dielectric layer 112a. In a further embodiment, a polysilicon material, including the amorphous polysilicon, may be deposited to form the first dielectric layer 112a. Any material with appropriate characteristic, including mighty connection to the substrate, great adherence to the first substrate 11, and suitable mechanic stiffness, may be used to replace the $Si_xO_y$ material. In some specific applications, a buffer layer may be used in the deposition process of the first dielectric layer 112a.

In some embodiments, the first dielectric layer 112a is formed by multiple deposition and polishing processes. For example, the first portion of the first dielectric layer 112a may be formed by using the high-density plasma (HDP) deposition process, and then using the chemical mechanical planarization (CMP) process to polish. The density of the device feature is a variable, and it may be a relative horizontal position difference, that is the deposition layer probably has an uneven upper surface. Hence, the multiple deposition and polishing processes may form an evener and flatter surface. The example of the deposition technology includes Tetraethyl Orthosilicate (TEOS), High-Density Plasma (HDP), Chemical Vapor Deposition (CVD), Low Pressure Chemical Vapor Deposition (LPCVD) and Thermal Oxidation. Besides, other materials may be also applied when a final layer (such as an oxide) is covered on.

In some embodiments, the deposition of the first dielectric layer 112a is processed according to the structure of the substrate. For example, when the first substrate 11 is a complementary metal oxide semiconductor (CMOS) substrate, the high temperature deposition process may damage the metal layer or cause the diffusion effect on the contacting surface of the circuits, and some circuits on the substrate may be affected. Therefore, in one specific embodiment of the present invention, the low temperature deposition, patterning and etching processes, such as processes in temperature lower than 500° C., are used to form the layers shown in FIGS. 10a to 10g. In another specific embodiment of the present invention, the deposition, patterning and etching processes are performed in the temperature lower than 450° C. to form layers shown in figures. After the first dielectric layer 112a is formed, it may be further patterned and etched to form multiple first interconnect via 118a. The first interconnect via 118a provides the electrical connection between the first substrate 11 and the first metal layer 111a later formed on the first dielectric layer 112a, and this process will be further explained below.

Then, a first metal layer 111a is formed above the first dielectric layer 112a. The first metal layer 111a fills in the first interconnect via 118a. In some embodiments, the first interconnect via 118a may be filled by a conductive material (such as tungsten). In one preferred embodiment, the first metal layer 111a is deposited by using plating, Physical Vapor Deposition (PVD) or Chemical Vapor Deposition (CVD) processes. FIG. 10a shows the first substrate 11 and the patterned first metal layer 111a after the etching process. For explaining the present invention in a more specific way, a lithography process is not shown in the manufacture process, wherein a photoresist layer is deposited on the first metal layer 111a and then is patterned to form an etching mask. In the lithography process, the size of the etching mask may be strictly controlled, and may be performed by using any suitable material resistant to the etching process while etching the metal layer. In one specific embodiment, the $Si_3N_4$ is used as the etching mask. Although an one-dimensional cross-sectional diagram is shown in FIG. 10a, it should be understood, however, a predetermined two-dimensional pattern is formed on the metal layer. In one embodiment, the first metal layer 111a comprises aluminum, copper, aluminum-copper-silicon alloy, tungsten and titanium nitride.

Then, a second dielectric layer 112b is formed above the first metal layer 111a. In some preferred embodiments, the process and material to form the second dielectric layer 112*b* is similar to the process of forming the first dielectric layer 112*a*. In other embodiments, the process and material to form the second dielectric layer 112*b* is different from the process of forming the first dielectric layer 112*a*. In other embodiments, the process and material to form the second dielectric layer 112*b* may be partially similar to and partially different from the process of forming the first dielectric layer 112*a*. After the second dielectric layer 112*b* is formed, it will then be patterned and etched to form multiple second interconnect via 118*b*. The second interconnect via 118*b* provides the electrical connection between the first metal layer 111*a* and the second metal layer 111*b* later formed on the second dielectric layer 112*b*, and this process will be explained more below. It should be noted here that, in addition to usage as the conductive path between the first metal layer 111*a* and the second metal layer 111*b*, the second interconnect via 118*b* may be used to form the second airtight ring 118*c* as well.

Then, a second metal layer 111*b* is formed above the second dielectric layer 112*b*. The second metal layer 111*b* fills into the second interconnect via 118*b*. In some embodiments, the second interconnect via 118*b* may be filled with a conductive material (such as tungsten). The patterned second metal layer 111*b* may be used as the electrode of the MEMS device, such as the first circuit 113*a* and the second circuit 113*b* used as detecting and/or driving circuits, the conductive contact 113*c* electrically connected to the second substrate 12, or the contact region 113*d* connecting to the third substrate 13. The contact region 113*d* comprises a conductive material having sufficient mechanic stiffness to support the connection interface. In one specific embodiment, the contact region 113*d* and the first substrate 11 form a low resistance ohmic contact. In some embodiments, the contact region 113*d* comprises germanium, aluminum or copper. In other embodiments, other materials may be used as the contact region 113*d*, such as gold, indium, or other solder capable of bottom-mounting and moistly improving metal stack.

Figure 10B:
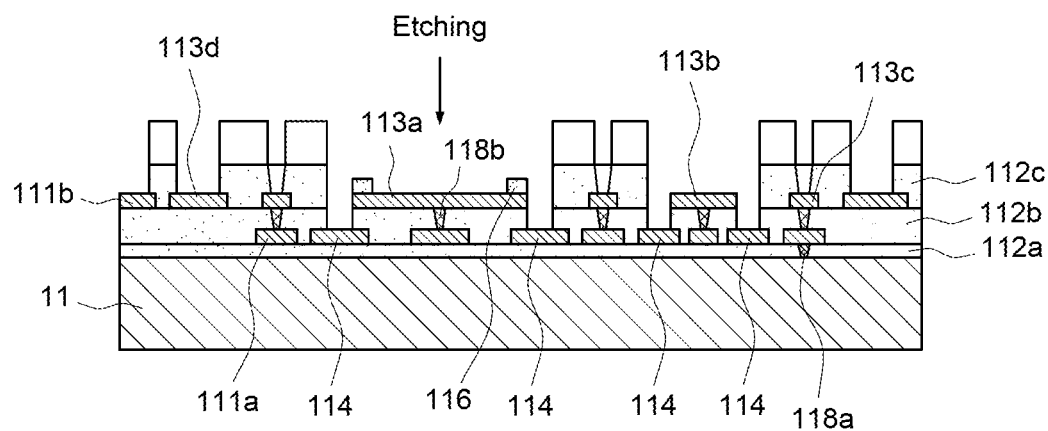

Referring to FIG. 10*b*, a third dielectric layer 112*c* is formed above the second dielectric layer 112*b*. The process and material to form the third dielectric layer 112*c* is similar to the process of forming the second dielectric layer 112*b* shown in FIG. 10*a*. Then, the third dielectric layer 112*c* is patterned to expose the first circuit 113*a*, the second circuit 113*b*, the conductive contact 113*c* and the contact region 113*d* of the second metal layer 111*b*. The etching process comprises one or more than one etching steps, such as anisotropic etching, oxide etching, wet etching or dry etching, for example Reactive Ion Etching (RIE). In one preferred embodiment, the etching process may define one or multiple mechanic anti-moving structures of the MEMS devices, such as the anti-moving bump 116 shown in FIG. 10*b*. In one preferred embodiment, one or multiple buffer layers may be used as etching stop layer. For example, the metal layer 114 of the first metal layer 111*a* can prevent the exposure of the first dielectric layer 112*a*. The person with ordinary skill in the art should understand the change, modify or replace of the embodiments is still in the scope of the present invention. In one preferred embodiment, the etching process can also define multiple fences 117. The fences 117 are configured surrounding the contact region 113*d* to prevent migrating of metal in the connection process and failing of the device. In one preferred embodiment, for manufacturing the pressure sensor shown in FIG. 3, at least one trench may be formed on the third dielectric layer 112*c*, and after mounting the second substrate 12 and the first substrate 11, the trench on the first substrate 11 can form the micro channel 17 as shown in FIG. 3.

Figure 10C:
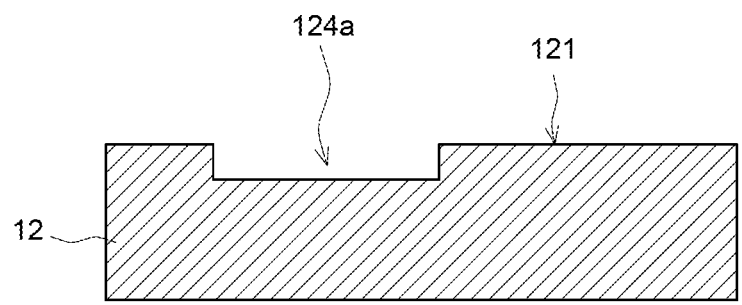

Referring to FIG. 10*c*, a second substrate 12 is provided and a notch 124*a* is formed on the first surface 121 of the second substrate 12. When the second substrate 12 and the first substrate 11 are connected, the notch 124*a* can help to reduce the interference from the first substrate 11. It should be understood that the notch may be also formed on the position corresponding to the reference element 125, and the final thickness of the reference element 125 has to be thicker than that of the MEMS device 124, or a suitable channel has to be formed to avoid the deformation of the reference element 125. It should be noted that this step may be also omitted when the embodiment shown in FIG. 6 is manufactured, and the notch 124*a* will be formed on the second surface 122 of the second substrate 12 in the later steps. Further, for manufacturing the embodiment shown in FIG. 5, the trench corresponding to the micro channel 115 has to be formed on the first surface 121 of the second substrate 12 in this step.

Figure 10D:
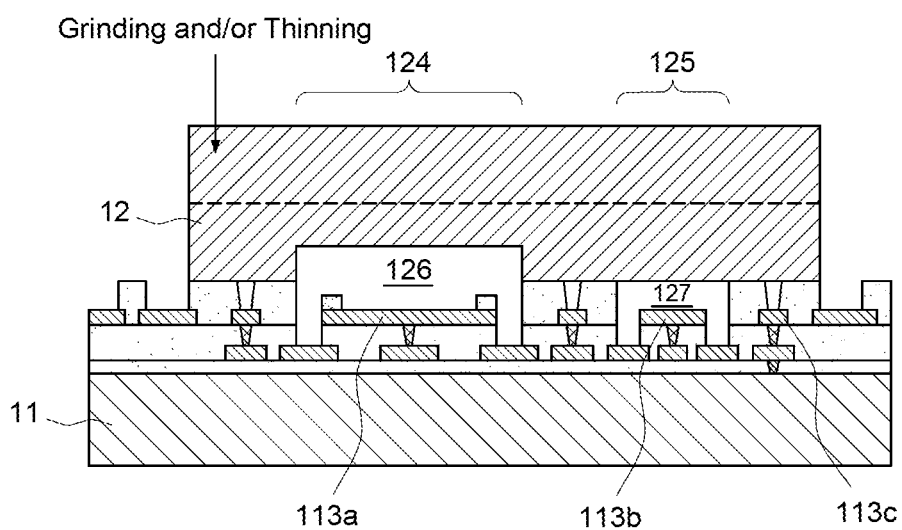

Referring to FIG. 10*d*, the first surface 121 of the second substrate 12 faces to the first substrate 11 and is mounted to the first substrate 11. The mounting of the second substrate 12 and the first substrate 11 may be achieved by using one of the methods of fusion bond, eutectic bonding, conductive eutectic bonding, soldering and bonding. In some embodiments, the Anisotropic Conductive Film (ACF) may be used to bond the second substrate 12 to the first substrate 11. After the second substrate 12 and the first substrate 11 are connected, a first chamber 126 and a second chamber 127 are defined, wherein the first circuit 113*a* is configured in the first chamber 126, and the second circuit 113*b* is configured in the second chamber 127.

Figure 10E:
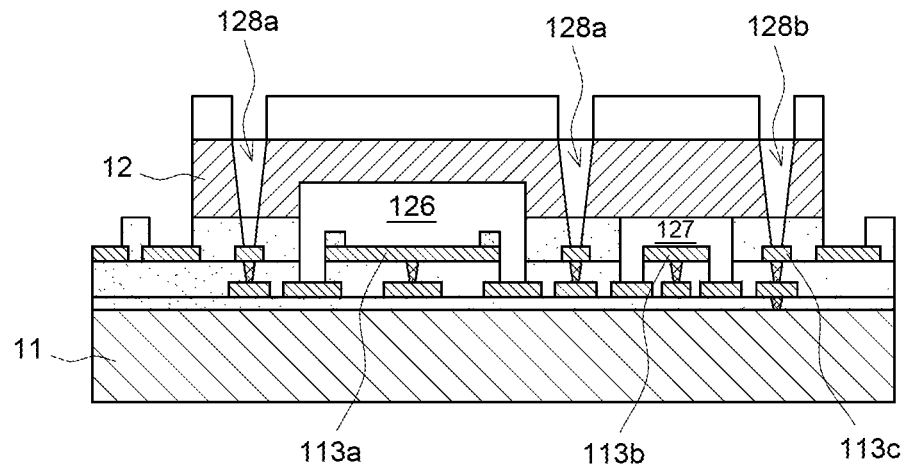

Then, the second substrate 12 is thinned to a predefined thickness by performing a grinding and/or other thinning procedures to the second substrate 12. As shown in FIG. 10*e*, in some embodiments, the remain thickness of the thinned region corresponding to the MEMS device 124 is about 10 μm to 100 μm, and the MEMS device 124 may be deformed with the pressure difference. The predefined thickness may be achieved by using the traditional thinning technology, such as chemical mechanical planarization (CMP), wet etching and/or dry etching, for example Reactive Ion Etching (RIE) technologies. There is no stopping layer to end the thinning process in the embodiment shown in FIG. 10*d*, and the thinning process adopts an exact control. The thickness of the second substrate 12 may be thinner or thicker than the predefined thickness in the absence of exact control during the thinning process, and the performance of the manufactured MEMS device will be thus affected. In other embodiments, an etching stopping layer is integrated into the second substrate 12 for the exact control of the thinning process. The person with ordinary skill in the art should understand the change, modify or replace of the embodiments is still in the scope of the present invention.

Referring to FIG. 10*e*, the second substrate 12 is patterned and etched to form a through slot 128*a* and a via 128*b*. The through slot 128*a* and the via 128*b* penetrate the first surface 121 and the second surface 122 of the second substrate 12. The through slot 128*a* expose the second metal layer 111*b* of the first substrate 11 to make the later-formed first airtight ring 123*a* connecting to the second metal layer 111*b* of the first substrate 11. The via 128*b* corresponds to the conductive contact 113*c* to expose the conductive contact 113*c*. It should be understood that, for manufacturing the embodiment shown in FIG. 3, the through slot 128*a* formed in this step may be connected to the micro channel 117 to achieve the connection of the first chamber 126 to the outside environment through the through slot 128a and the micro channel 117, and then the anti-sticking material may be introduced to the first chamber 126 and form an anti-sticking layer on the inner surface of the first chamber 126.

Figure 10F:
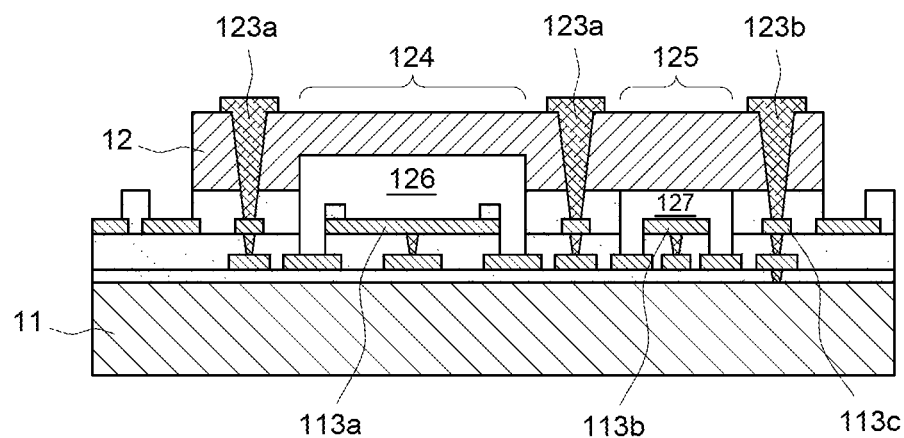

Referring to FIG. 10f, then, filler is filled into the through slot 128a to form the first airtight ring 123a. A conductive material (such as tungsten) is stuffed into the via 128b to make the via 128b be a conductive via 123b and electrically connect the second substrate 12 and the conductive contact 113c of the first substrate 11. In one preferred embodiment, the filler filled in the through slot 128a may be the same as that in the via 128b. As described above, the forming and filling steps of the through slot 128a and the via 128b may be finished together with same process. Therefore, there is no extra process step needed to form the first airtight ring 123a, and the process is essentially simplified. It should be noted here that the forming and filling steps of the through slot 128a and the via 128b may be also finished according to the actual requirement and with suitable processes respectively. It should be understood that, for manufacturing the embodiment shown in FIG. 3, the step of filling the through slot 128a seals the micro channel 117 simultaneously to retain the airtightness of the first chamber 126 without extra process.

Figure 10G:
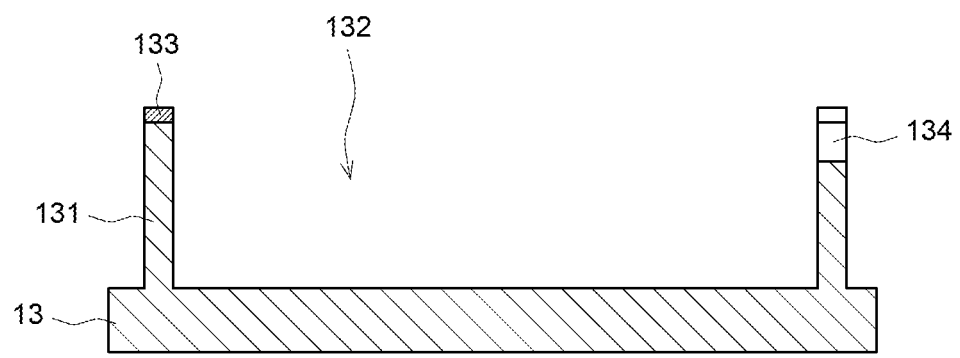

Referring to FIG. 10g, a third substrate 13 is provided. In some embodiments, the third substrate 13 comprises doped silicon, ceramic with a conductive coating, glass covered by a conductive coating (such as ITO), or metal layer like Tantalum oxide. A sticking layer is placed on the surface of the third substrate 13. The sticking layer can assist the mounting between the third substrate 13 and the first substrate 11. In some embodiments, the sticking layer is formed by depositing a seed layer, such as titanium/gold, and then depositing a conductive layer (such as plating gold). Then, the third substrate 12 is patterned and etched to form a plurality of bracket structure 131. The third substrate 13 is etched to form the bracket structure 131, and a notch region 132 is formed on the third substrate 13. The partial sticking layer is remained on the bracket structure 131 to form the contact pad 133. The notch region 132 may be configured surrounding the second substrate 12. The horizontal size of the notch region 132 is selected according to the geometric structure of the second substrate 112 covered by the third substrate 13. In one embodiment, in the process of forming the bracket structure 131, one or multiple trenches may be formed at the terminal of the bracket structure 131. When the third substrate 13 is connected to the first substrate 11 through the bracket structure 131, the trenches may be used as the channel 134 connecting the notch region 132 and the outside, as shown in FIG. 1. The connection step of the third substrate 13 and the first substrate 11 may be achieved by using one of the methods of fusion bond, glass frit bonding, eutectic bonding, conductive eutectic bonding, soldering and bonding. In some embodiments, the MEMS device 124 is protected by using a lower adopted temperature for connecting the third substrate 13 and the first substrate 11 than the adopted temperature for connecting the second substrate 12 and the first substrate 11 to. The third substrate 13 is conductive and can shield the electromagnetic disturbance (EMI) of the second substrate 12. It should be noted that the third substrate 13 is an optional device, that is, the pressure sensor of the present invention may be function as well in the case of absence of the third substrate 13.

To sum up the foregoing descriptions, the pressure sensor using the MEMS device and the manufacture method thereof are achieved by using an airtight ring surrounding a chamber defined by the first substrate and the second substrate. The airtight ring extends from the upper surface of the second substrate to the interface between the first substrate and the second substrate and further protruding from the interface. Hence, the airtight ring is capable of blocking extension of the chamber to the interface between the first substrate and the second substrate, preventing the air leakage from the surface between the first substrate and the second substrate, and therefore retaining the airtightness of the chamber.

While the invention may be subject to various modifications and alternative forms, a specific example thereof has been shown in the drawings and is herein described in detail. It should be understood, however, that the invention is not to be limited to the particular form disclosed, but on the contrary, the invention is to cover all modifications, equivalents, and alternatives falling within the spirit and scope of the appended claims.

What is claimed is:

1. A pressure sensor, comprising:
a first substrate comprising a metal layer, wherein the metal layer is partially exposed on a surface of the first substrate to form a first circuit, a second circuit and a conductive contact; and
a second substrate comprising a first surface and a second surface, wherein the second substrate faces the surface of the first substrate with the first surface and is electrically connected to the conductive contact, wherein the second substrate comprises:
a MEMS element corresponding to the first circuit and defining an airtight chamber with the first substrate and the second substrate;
a reference element corresponding to the second circuit and kept a fixed distance from the second circuit; and
a first airtight ring configured for surrounding the chamber, wherein the first airtight ring penetrates the second surface of the second substrate, extends to an interface between the first substrate and the second substrate, and protrudes from and breaks out the interface.

2. The pressure sensor according to claim 1, wherein the first airtight ring connects to the metal layer of the first substrate.

3. The pressure sensor according to claim 1, wherein the first airtight ring comprises a conductive material.

4. The pressure sensor according to claim 1, further comprising:
a second airtight ring corresponding to the first airtight ring, configured on the first substrate and connecting the metal layer and another lower metal layer.

5. The pressure sensor according to claim 1, further comprising:
an anti-sticking layer configured on the inner surface of the chamber, wherein the chamber comprises at least one micro channel extending to the first airtight ring, and the micro channel is configured on the first substrate or the second substrate.

6. The pressure sensor according to claim 5, wherein the micro channel comprises a bent portion bending to horizontal or vertical direction.

7. The pressure sensor according to claim 5, wherein the micro channel comprises a dam for reducing the inner diameter of the micro channel.

8. The pressure sensor according to claim 1, wherein the MEMS element comprises a notch configured on side of the first surface or side of the second surface.

9. The pressure sensor according to claim 1, wherein an anti-moving bump is configured on the surface of the first substrate corresponding to the MEMS element.

10. The pressure sensor according to claim 1, wherein the second substrate comprises a conductive via penetrating the first surface and the second surface of the second substrate, wherein the conductive via is electrically connected to the conductive contact and the second substrate through an ohmic contact, and the ohmic contact region is made of at least one of silicon, aluminum-copper alloy, titanium nitride and tungsten.

11. The pressure sensor according to claim 10, wherein the conductive via is integrated into the first airtight ring.

12. The pressure sensor according to claim 1, wherein the first substrate comprises a complementary metal oxide semiconductor substrate.

13. The pressure sensor according to claim 1, further comprising:
- a third substrate having a notch region and a plurality of bracket structure, the third substrate is configured above the second substrate and is connected to the first substrate through the bracket structure to place the second substrate in the notch region.

14. The pressure sensor according to claim 13, wherein the third substrate comprises a channel configured on a terminal of the bracket structure.

* * * * *